United States Patent [19]
Sakiyama et al.

[11] Patent Number: 5,699,064
[45] Date of Patent: Dec. 16, 1997

[54] OVERSAMPLING D/A CONVERTER USING A BIDIRECTIONAL SHIFT REGISTER

[75] Inventors: Shiro Sakiyama; Shiro Dosho; Masakatsu Maruyama; George Hayashi; Seizo Inagaki, all of Osaka; Akira Matsuzawa, Kyoto, all of Japan

[73] Assignee: Matsushita Electric Industrial Co., Ltd., Osaka, Japan

[21] Appl. No.: 509,665

[22] Filed: Jul. 31, 1995

[30] Foreign Application Priority Data

Aug. 1, 1994 [JP] Japan .................... 6-180035

[51] Int. Cl.⁶ .................................................. H03M 1/78
[52] U.S. Cl. ........................... 341/154; 341/77; 341/143
[58] Field of Search ................................ 341/76, 77, 143, 341/144, 153, 154; 377/69, 77, 80, 81

[56] References Cited

U.S. PATENT DOCUMENTS 3,925,731 12/1975 Brainard et al. ................... 341/143
4,122,442 10/1978 Henry ................................. 341/143

FOREIGN PATENT DOCUMENTS 2-184119 7/1990 Japan .
4-150416 5/1992 Japan .

*Primary Examiner*—Howard L. Williams
*Attorney, Agent, or Firm*—McDermott, Will & Emery

[57] ABSTRACT

In an interpolative modulator, a signal which varies by only ±1 with one clock from a 1-bit quantizer is used as a shift-direction control signal. The shift-direction control signal is given to a bidirectional shift register. The bidirectional shift register shifts data based on the value of the shift-direction control signal that has been received. The output from the bidirectional shift register is given as a control signal to a resistive-ladder-type D/A converter. The resistive-ladder-type D/A converter outputs an analog potential corresponding to a switch selected by the above control signal. Therefore, if a delay difference occurs between any two bits, two adjacent switches are simply selected simultaneously, so that the output from the resistive-ladder-type D/A converter varies continuously. Consequently, there can be provided an oversampling D/A converter of resistive-ladder type with high accuracy and an increased yield, which is free from glitch (transiently generated noise).

20 Claims, 19 Drawing Sheets

Fig.6

| −1 | 1 1 1 ------ 1 1 1 |
|----|---------------------|
| +1 | 0 0 0 ------ 0 0 1 |

Fig.7(a)
WHEN RISE TIME OF BIDIRECTIONAL SHIFT REGISTER FROM "0" TO "1" IS EQUAL TO FALL TIME THEREOF FROM "1" TO "0"

|  | SELECTED SWITCH NUMBER |
|---|---|
| DECIMAL NOTATION | 0 → -1 |

Fig.7(b)
WHEN RISE TIME OF BIDIRECTIONAL SHIFT REGISTER FROM "1" TO "0" IS LONGER THAN RISE TIME THEREOF FROM "0" TO "1"

|  | SELECTED SWITCH NUMBER |
|---|---|
| DECIMAL NOTATION | 0 → 0,-1 → -1 |

Fig.7(c)
WHEN FALL TIME OF BIDIRECTIONAL SHIFT REGISTER FROM "0" TO "1" IS LONGER THAN FALL TIME THEREOF FROM "1" TO "0"

|  | SELECTED SWITCH NUMBER |
|---|---|
| DECIMAL NOTATION | 0 → — → -1 |

Fig.7(d)

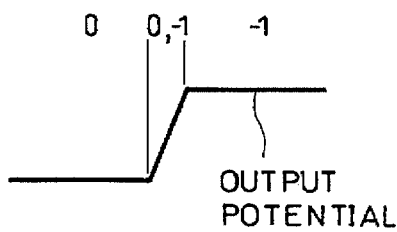

Fig.7(e)

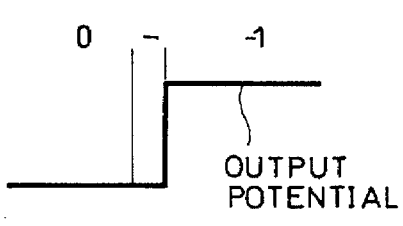

Fig.10

| -1 | 1 1 1 ------ 1 1 1 |
|----|---------------------|
| 0  | 0 0 0 ------ 0 0 0 |
| +1 | 0 0 0 ------ 0 0 1 |

Fig.19 (a)
PRIOR ART

WHEN NO DELAY OCCURS IN MSB IN 4-bit DECODER

|  | SELECTED SWITCH NUMBER | |
|---|---|---|
| DECIMAL NOTATION | 0 → | -1 |
| BINARY NOTATION | 0000 → | 1111 |

Fig.19(b)
PRIOR ART

WHEN DELAY OCCURS IN MSB IN 4-bit DECODER

|  | SELECTED SWITCH NUMBER | | |
|---|---|---|---|
| DECIMAL NOTATION | 0 → | 7 → | -1 |
| BINARY NOTATION | 0000 → | 0111 → | 1111 |

OVERSAMPLING D/A CONVERTER USING A BIDIRECTIONAL SHIFT REGISTER

BACKGROUND OF THE INVENTION

The present invention relates to a D/A converter of oversampling type for converting a digital signal to an analog signal and, more particularly, to an improved D/A converter which performs D/A conversion with higher accuracy, consumes lower power, and provides an increased yield.

With the recent advance of semiconductor microprocessing technology, a D/A converter of oversampling type has received attention as a means for converting a digital signal to an analog signal. The oversampling D/A converter is a D/A conversion system in which the rate at which an input signal is sampled is converted to a sampling rate tens to hundreds of times as high as the bandwidth of the input signal, thereby localizing quantizing noise in the range of higher frequencies. Consequently, the oversampling D/A conversion system provides an analog output signal with high resolution, though it has a smaller number of bits than the input digital signal.

Among modulation techniques used in the oversampling D/A converter, the following three are known:

1. Delta-Sigma Modulation
2. Delta Modulation
3. Interpolative Modulation

The delta-sigma modulation is a method of performing quantization with respect to the quantizing noise or the like so that it is localized in the range of higher frequencies. The delta modulation is a method of calculating a predicted value for the input signal and quantizing the difference signal of the input signal and predicted value. In the delta modulation, modulation is not performed with respect to the quantizing noise. The interpolative modulation is a combination of the above delta-sigma modulation and delta modulation, in which the delta-sigma modulation is performed with respect to the differential signal of the input signal and predicted value.

In the delta-sigma modulation, the total amount of power for the quantizing noise is generally large, but the power for in-band quantizing noise is relatively small, since the quantizing noise is localized in the range of higher frequencies. In the delta modulation, on the other hand, it is possible to reduce the total amount of power for the quantizing noise to the extent that slope overload does not occur. When the two techniques are compared with each other in oversampling at a sampling rate tens of times as high as the bandwidth of the input signal or higher, less in-band quantizing noise is observed in the delta-sigma modulation. However, since out-band noise in the input signal is larger in the delta-sigma modulation than in the delta modulation, if the delta-sigma modulation is to be used in a D/A converter, it requires abrupt post filter for removing the out-band noise from the analog output signal.

On the other hand, the delta modulation does not require the abrupt post filter required by the delta-sigma modulation. The interpolative modulation, which is a combination of the above two techniques, has the advantages of the both techniques. In short, the power for the in-band quantizing noise is small, since the quantizing noise is localized in the range of higher frequencies, and the total amount of power for the quantizing noise itself is small. Accordingly, the interpolative modulation does not require the abrupt post filter required by the delta-sigma modulation, similarly to the delta modulation. Hence, it may be concluded that the interpolative modulation is suitable for use in an oversampling D/A converter.

The following are techniques for performing D/A conversion with respect to digital signal output data from a modulator:

1. SCF Conversion (of charge-distribution type using a capacitor array)
2. PWM Conversion (of pulse-width-output type by pulse width modulation)
3. Voltage Potentiometer Conversion (of voltage-output type using a resistive ladder)

Among these, the above SCF conversion and PWM conversion are used particularly frequently in performing D/A conversion with respect to oversampled data. However, in the above SCF conversion, relative accuracy of the capacitors, leakage current, feedthrough in switching operation, and the like become problems. If the capacitance of each of the capacitors is increased in order to minimize the influence exerted by these problems, the capacitor may incur an increase in power consumption, since the capacitor is incessantly charged and discharged.

In the above PWM conversion, on the other hand, it is necessary to equalize the driving abilities of push-pull transistors. If there is a difference between their driving abilities, the output signal may suffer distortion if the load is large and, moreover, high accuracy is required on a clock for determining the pulse width.

Although there are various other D/A conversion techniques than the ones described above, a detailed description will be given below to the above voltage potentiometer conversion.

FIG. 16 shows, by way of example, the structure of a system used in the case where the interpolative modulation is performed with respect to an oversampled digital input signal and the D/A conversion of voltage-potentiometer type is performed with respect to a digital output signal having a smaller number of bits.

In the drawing are shown: an interpolative modulator 1; a decoder 5; and a resistive-ladder-type D/A converter 3. The interpolative modulator 1 performs interpolative modulation with respect to an m-bit digital input signal that has been oversampled such that it is converted to an n-bit digital output signal having a smaller number of bits (n<m). The n-bit digital output signal obtained through the conversion is decoded by the decoder 5 and then given as a switch control signal to the resistive-ladder-type D/A converter 3.

Next, the above structure of FIG. 16 will be described in greater detail.

FIG. 17 is a signal wire diagram of the above interpolative modulator 1. In the drawing are shown: delay elements 10,1 to 10,3; adders 11,1 and 11,2; and a 1-bit quantizer 12. The following equation represents the system function Y(z) of a digital output signal Y from the interpolative modulator 1 in the block structure shown in FIG. 17:

$$Y(z)=X(z)+(1-z^{-1})*Q(z)$$

where X represents an input signal, Y represents an output signal, and Q represents an error between the input signal and output signal to and from the 1-bit quantizer 12, i.e., the quantizing noise. The present description uses first-order interpolative modulation as an example of the modulation technique. In FIG. 17, first-order delta-sigma modulation is combined with first-order delta modulation. The output from the adder 11,2 in the drawing represents a predicted value peculiar to the delta modulation. The first-order delta-sigma modulation is performed with respect to the difference signal of the input signal X and predicted value. Each of the delay elements 10,1 to 10,3 delays the input signal by a given period of time with a clock for delay element and then outputs it. The quantizer 12 represents the output signal from the adder 11,1 in one of the two values of +1 or −1, depending on whether the value thereof is positive or negative. The adder 11,2 generates a predict signal for the input signal by integrating the output from the quantizer 12 and feedbacks its output to the adder 11,1 such that the difference signal of the digital input signal and predicted value is reduced in number of bits. The adder 11,2 adds +1 or −1 output from the quantizer 12 to the output result from the adder 11,2 obtained in the preceding step. Therefore, it will be understood that, in the interpolative modulation, the output signal Y varies from the output signal Y obtained in the preceding step by only ±1.

FIG. 18 shows a specific circuit diagram of the decoder 5 and resistive-ladder-type D/A converter 3.

The decoder 5 in the drawing consists of $2^n$ n-input AND gates 50,0, 50,1p to 50,2p, and 50,1m to 50,3m. Of the $2^n$ n-input AND gates, only one is decoded so as to output a HIGH signal to the n-bit digital input data. For example, if the n-bit input signal is 0, only the AND gate 50,0 is decoded so as to output a HIGH signal. If the n-bit input signal is 1, on the other hand, only the AND gate 50,1p is decoded so as to output a HIGH signal.

The resistive-ladder-type D/A converter 3 consists of a resistor 30 and switches 31,0, 31,1p and 31,2p, and 31,1m to 31,3m. The switches have their respective one ends connected to individual potentials obtained by dividing a reference potential with the resistor such that only the potential connected to the switch that has been turned ON is output as the analog output signal. The control signal for turning ON and OFF the respective switches 31,0, 31,p to 31,2p, and 31,1m to 3,3m is given from the outputs of the n-input AND gates 50,0, 50,1p and 50,2p, and 50,1m to 50,3m (it is assumed that any one of the switches is turned ON when the output from the decoder is HIGH).

Thus, in the interpolative modulator 1, the m-bit digital input signal that has been oversampled is converted to the n-bit digital output signal having a smaller number of bits. The n-bit digital output signal obtained through the conversion is decoded by the decoder 5 and, after that, given as the switch control signal to the resistive-ladder-type D/A converter 3, in response to which the resistive-ladder-type D/A converter 3 outputs a potential corresponding to the switch control signal. In this manner, the resistive-ladder-type D/A converter 3 outputs an analog value in accordance with the n-bit digital output value having a smaller number of bits.

As described above, the interpolative modulation is suitable for use in an oversampling D/A converter. On the other hand, the D/A converter of voltage-potentiometer type is simple in structure and provides a high yield, which is suitable for low-power operation.

However, the D/A converter described above has the following disadvantage since, when the n-bit digital output signal is input to the individual AND gates 50,0 to 50,3, the whole signal is not input to the individual AND gates at a time, but some bit of the signal is input only after being delayed by a given period of delay time.

The disadvantage will be described with reference to FIGS. 19. Each of FIGS. 19(a) and 19(b) shows the transition of the number of the switch (selected switch number) selected by the resistive-ladder-type D/A converter 3 based on the output from the decoder 5 when it is assumed that the number of bits n of the n-bit digital output signal from the interpolative modulator 1 in FIG. 16 is "4." FIG. 19(a) shows the case where the delay values of all the bits forming the output signal are equal, while FIG. 19(b) shows the case where a delay occurs in the most significant bit (MSB). As shown in FIG. 19(a), in the case where the delay values of all the bits are equal, if the 4-bit digital signal data from the interpolative modulator 1 shifts from "0" to "−1", the selected switch number also shifts from "0" to "−1". However, in the case where a delay occurs in the MSB bit, as shown in FIG. 19(b), if the 4-bit digital signal data shifts from "0" to "−1", the selected switch number momentarily shifts from "0" to "7" and then from "7" to "−1." The phenomenon is caused by transiently generated noise termed "glitch," which presents a problem in the resistive-ladder-type D/A converter.

Although the above example has described the worst possible case when a delay occurs in the most significant bit, even if the amount of delay is properly regulated, the D/A converter having the above decoder shown in FIG. 18 is basically susceptible to the above disadvantageous glitch.

SUMMARY OF THE INVENTION

An object of the present invention is to provide a lower-power oversampling D/A converter comprising a resistive-ladder-type D/A converter, which is free from the above glitch, performs D/A conversion with higher accuracy, and provides an increased yield.

To attain the above object, the present inventors have noted that a variation in the output from an interpolative modulator or the like is only ±1 and constituted the oversampling D/A converter such that the resistive-ladder-type D/A converter is controlled based on the output from the interpolative modulator, thereby preventing the transient noise and eliminating the glitch.

Specifically, the oversampling D/A converter of the present invention comprises: a signal output unit for receiving a digital signal and outputting a digital signal the value of which varies, with one clock, by a specified step voltage toward positive voltages or toward negative voltages, depending on a variation in the input signal; a bidirectional shift register having a plurality of registers being juxtaposed, the above bidirectional shift register receiving an output signal from the above signal output unit and using it as a data-shift-direction control signal, while repeatedly receiving a data shift clock at given time intervals and shifting data, on each receipt of the data shift clock, to the register in a previous or subsequent stage, depending on a value of the above data-shift-direction control signal; and an output potential selector for selecting, in accordance with outputs from the respective registers of the above bidirectional shift register, one of a plurality of potentials obtained by dividing a difference between a first reference potential and a second reference potential with a resister interposed therebetween.

In the above oversampling D/A converter of the present invention, the signal output unit is composed of an oversampling interpolative modulator, the above interpolative modulator consisting of a combination of: a quantizer for quantizing a signal input thereto into one of two values of +1 and −1, depending on a value of the signal; a delta-sigma modulator for modulating quantizing noise resulting from the quantization by the above quantizer; and a delta modulator for obtaining a predicted value corresponding to the digital input signal and quantizing a difference signal representing a difference between the predicted value and a value of the above digital input signal.

Moreover, in the above oversampling D/A converter of the present invention, the bidirectional shift register has a data maintenance circuit for maintaining, if the register positioned in a first stage is holding data and data shift to a stage previous to the first stage is requested or if the register positioned in a final stage is holding data and data shift to a stage subsequent to the final stage is requested, the holding of data by the register in the first or final stage.

Furthermore, in the above oversampling D/A converter of the present invention, each of the plurality of registers of the bidirectional shift register has a set terminal, a reset terminal, and an additional specified data detector, the above specified data detector detecting a coincidence between the output signal from the above signal output unit and a predetermined value, a coincidence detect signal from the above specified data detector being input to the set terminal of a specified one of all the registers constituting the bidirectional shift register and to the respective reset terminals of the other registers.

With the above structure, in the bidirectional shift register of the oversampling D/A converter of the present invention, the signal which is output from the signal output unit and varies by the specified step voltage with one clock is used as the shift-direction control signal, so that the resistive-ladder-type D/A converter is controlled by on-off operation of their switches using the bidirectional shift register. Therefore, even if there are a plurality of analog output potentials from the resistive-ladder-type D/A converter during the period during which the analog potential is shifting, the output potentials are adjacent to each other, so that no transient noise occurs. Consequently, the conventional glitch is eliminated and it becomes possible to provide an oversampling D/A converter with high accuracy and an increased yield.

In the oversampling D/A converter of the present invention, if the register positioned in the final stage of the bidirectional register is holding data and data shift to its subsequent stage is requested, in particular, the output from the register in the final stage is input to the input terminal of its own, so that there is no OFF state in which the output potential selector (resistive-ladder-type D/A converter) outputs no analog potential. Even when the amplitude of the digital input signal is increased in the transient response in converting the sampling rate, in particular, the output potential is stable. Moreover, when used in the environment which does not require a significantly large S/N ratio of the input signal with an increased amplitude, the number of stages of the registers constituting the bidirectional shift register can be reduced by restraining the range of the analog output voltages. Consequently, circuit miniaturization can be realized, while the S/N ratio of the input signal with a small amplitude remains high without deteriorating.

Furthermore, in the oversampling D/A converter of the present invention, the potential of the analog output signal is initialized by the coincidence detect signal from the specified data detector, so that it is possible to set a reference voltage (DC potential) for the analog output signal.

The above objects and novel features of the present invention will be more apparent from the reading of the following description in conjunction with the accompanying drawings.

BRIEF DESCRIPTION OF THE DRAWINGS

The accompanying drawings show the preferred embodiments of the present invention, in which:

FIG. 6 is a view showing an n-bit output signal from a delay element of the first embodiment;

FIGS. 7 are views for illustrating the operation of the first embodiment, of which FIG. 7(a) is a view showing the transition of a selected switch number in the case where the rise time of the bidirectional shift register from "0" to "1" is equal to the fall time thereof from "1" to "0," FIG. 7(b) is a view showing the transition of the selected switch number in the case where the fall time of the bidirectional shift register from "1" to "0" is longer than the rise time thereof from "0" to "1," FIG. 7(c) is a view showing the transition of the selected switch number in the case where the rise time of the bidirectional shift register from "0" to "1" is longer than the fall from thereof from "1" to "0," FIG. 7(d) is a view showing the transition of an output potential in the case shown in FIG. 7(b), and FIG. 7(e) is a view showing the transition of the output signal in the case shown in FIG. 7(c);

FIG. 10 is a view showing an n-bit output signal from a delay element of the second embodiment;

FIGS. 13 are views for illustrating operation in a transient response in the variation of the bidirectional shift register, of which

FIGS. 19 are views for illustrating the operation of the conventional oversampling D/A converter, of which FIG. 19(a) is a view showing the transition of a selected switch number in the case where no delay occurs in the MSB bit in a 4-bit decoder, and FIG. 19(b) shows the transition of the selected switch number in the case where a delay occurs in the MSB bit in the 4-bit decoder.

DETAILED DESCRIPTION OF THE INVENTION

Below, preferred embodiments of the present invention will be described with reference to the accompanying drawings.

(First Embodiment)

Figure 1:
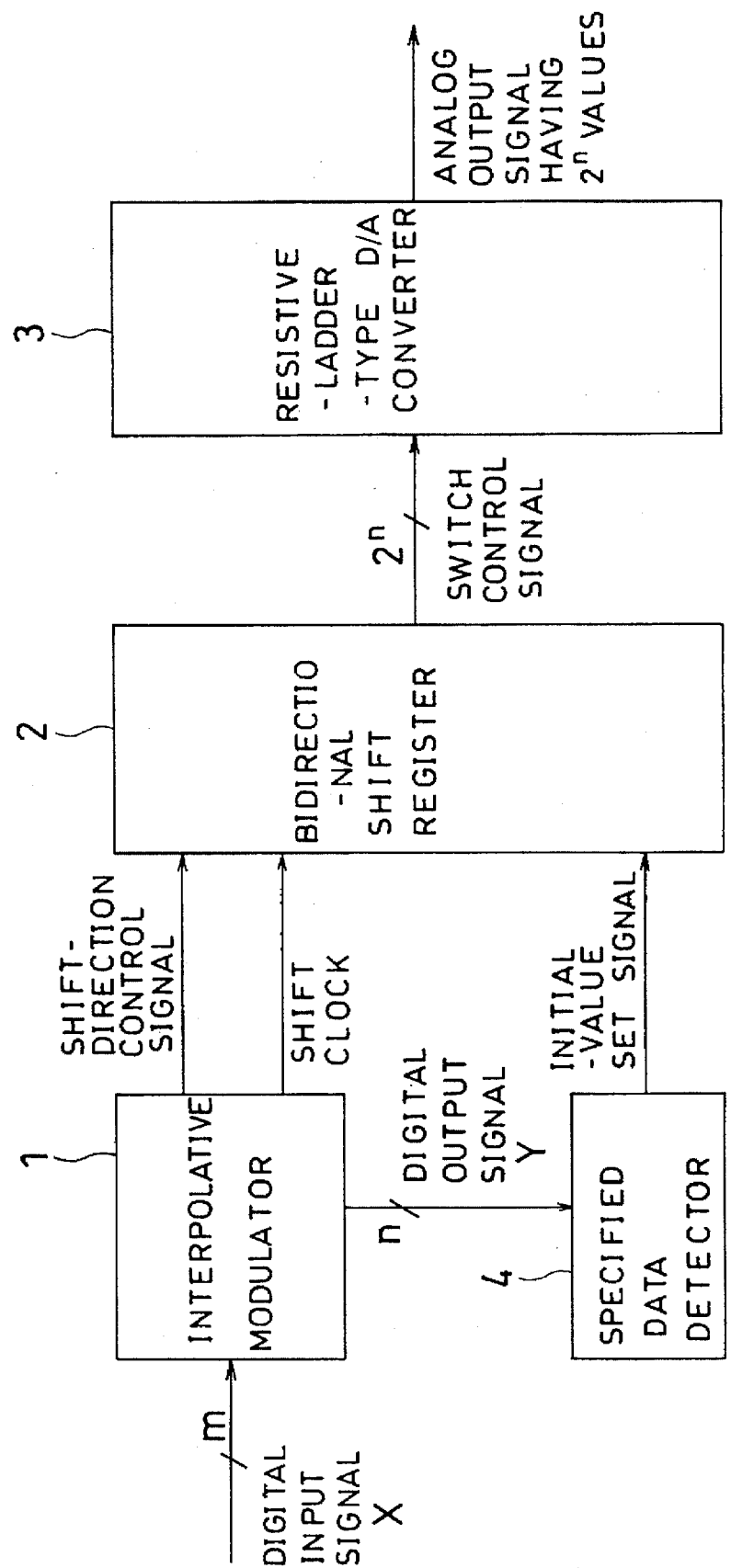
FIG. 1 is a view showing the overall structure of a D/A converter of a first embodiment.

FIG. 1 shows a first embodiment of an oversampling D/A converter according to the present invention.

By way of example, FIG. 1 shows the structure of the oversampling D/A converter in the case where interpolative modulation is performed with respect to a digital input signal that has been oversampled so as to reduce the number of bits of a digital output signal and then voltage-potentiometer-type D/A conversion is performed with respect the resulting digital output signal smaller in number of bits.

In the drawing are shown: an interpolative modulator (signal output unit) 1; a bidirectional shift register 2; a resistive-ladder-type D/A converter (output potential selector) 3; and a specified data detector 4. The above interpolative modulator 1 performs interpolative modulation with respect to an m-bit digital input signal that has been oversampled and outputs an n-bit digital signal having a smaller number of bits, similarly to the conventional structure described above. The n-bit digital output signal obtained through the conversion is transmitted to the specified data detector 4. The output (coincidence detect signal) from the specified data detector 4 is used as an initial-value set signal for initializing the bidirectional shift register 2. The bidirectional shift register 2 is initialized by the initializing signal output from the specified data detector 4 and controlled by a shift-direction control signal (to be described later) and a shift clock, each output from the interpolative modulator 1. The output from the bidirectional shift register 2 is used as a switch control signal for the resistive-ladder-type D/A converter 3.

Below, a more detailed description will be given to the above structure.

Figure 2A:
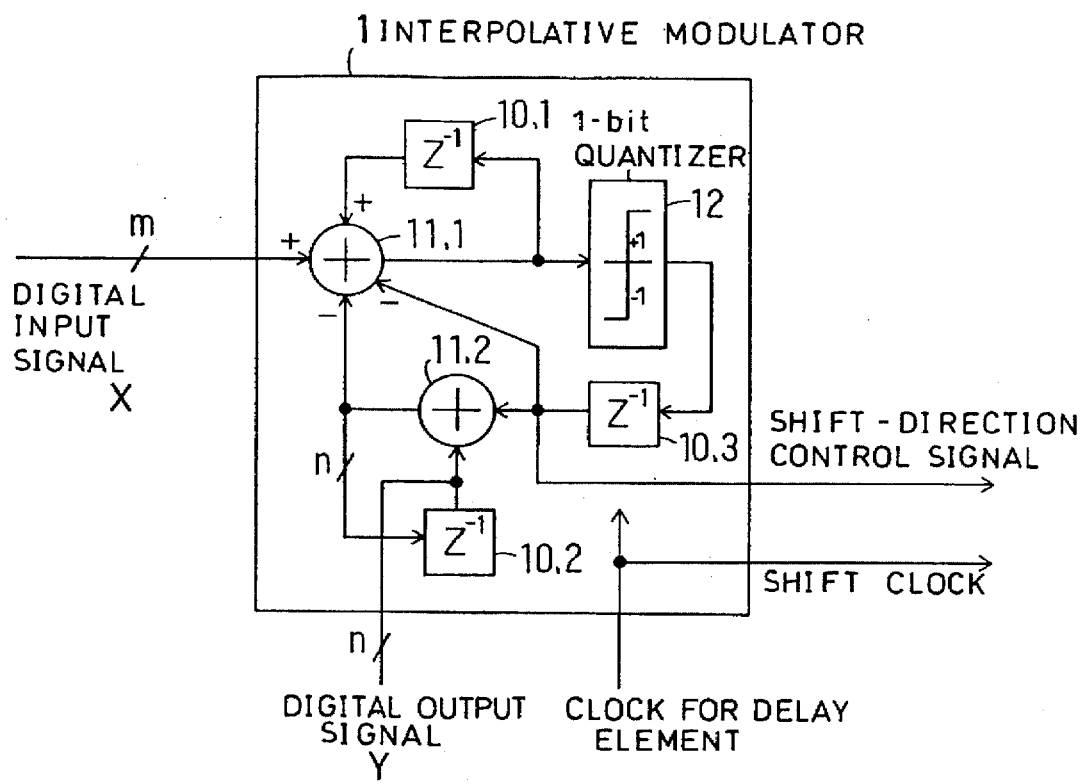
FIG. 2(a) is a signal wire diagram of an interpolative modulator of the first embodiment.
Figure 17:
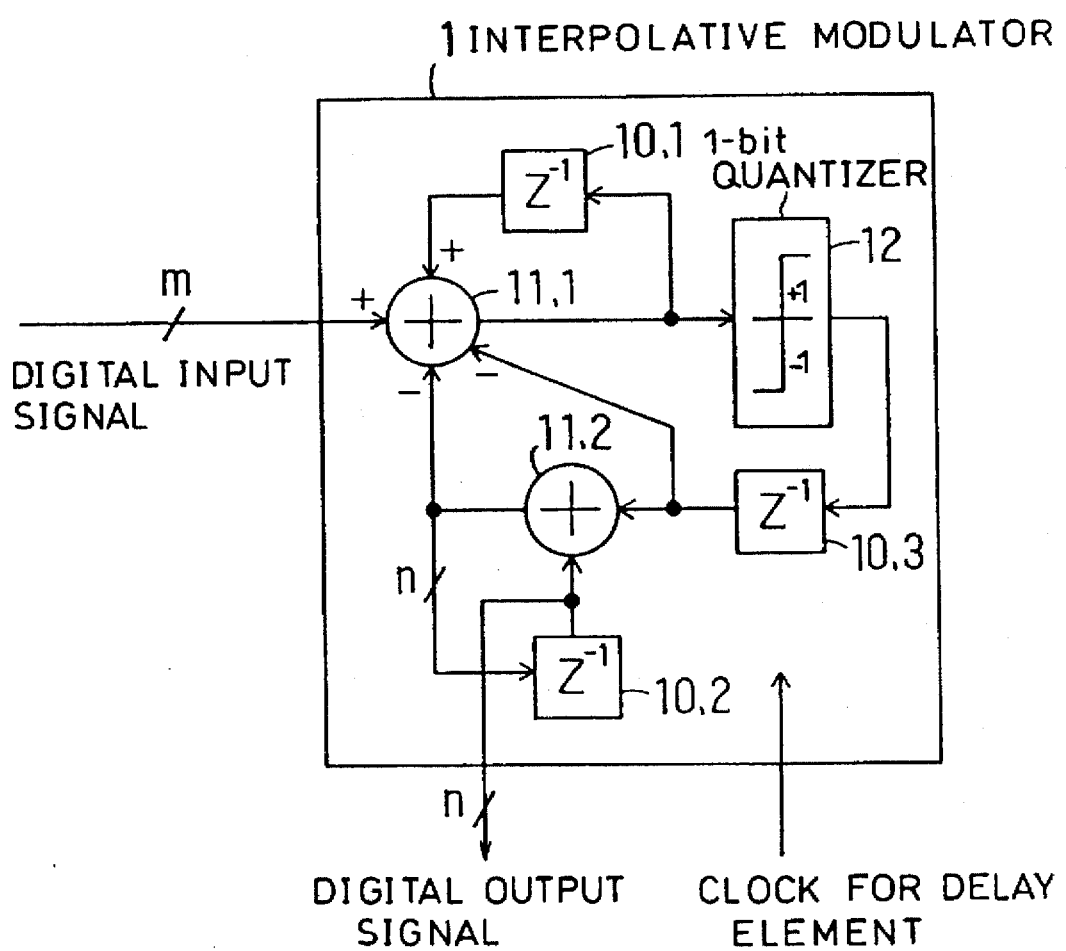
FIG. 17 is a signal wire diagram of a conventional interpolative modulator.

FIG. 2(a) is a signal wire diagram of the interpolative modulators 1, which has the same structure as the conventional interpolative modulator of FIG. 17 and uses, by way of example, first-order interpolative modulation as the modulation technique. The interpolative modulator 1 of FIG. 2(a) performs a combination of first-order delta modulation shown in FIG. 2(b) and first-order delta-sigma modulation shown in FIG. 2(c). In the interpolative modulator 1 of FIG. 2(a), the system function Y(z) of a digital output signal Y is represented by the following equation (1):

$$Y(z)=X(z)+(1-z^{-1})*Q(z) \tag{1}$$

where X is an input signal, Y is an output signal, and Q is an error between the input signal and output signal to and from the 1-bit quantizer 12, i.e., quantizing noise.

A description will be given to the signal wire diagram of FIG. 2(a) illustrating the above system function. However, since the signal wire diagram of FIG. 2(a) is a combination of the signal wire diagrams of FIGS. 2(b) and 2(c), the signal wire diagrams of FIGS. 2(b) and 2(c) will be described instead. In the delta-type modulator of FIG. 2(b) are shown: a first delay element 10,3; a second delay element 10,2; a first adder 11,1; a second adder 11,2; and a 1-bit quantizer 12.

Figure 6:
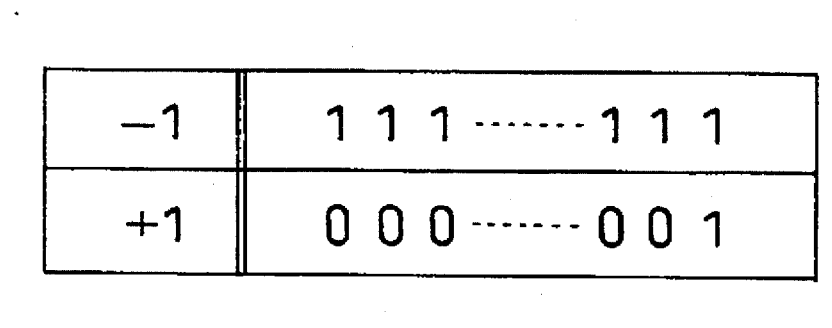

As will be described later, the adder 11,2 outputs a predicted value peculiar to the delta modulation. The adder 11,1 subtracts, from the input signal X, the above predicted value from the adder 11,2 and outputs the difference signal thereof. The quantizer 12 receives the output signal (difference signal) from the adder 11,1 and outputs "+1" if the signal value is positive or "−1" if the signal value is negative, thereby quantizing the output signal from the adder 11,1 into one of the two values. The delay element 10,3 outputs the output from the above quantizer 12 after delaying it for a given period of time in accordance with the clock for delay element. The output from the delay element 10,3 (the signal having the value "+1" or "−1" from the quantizer 12) is converted to the n-bit signal having a smaller number of bits than the m-bit input signal (n<m), though the conversion process is not shown in FIG. 2. For example, if the output from the delay element 10,3 is "−1," as shown in FIG. 6, it is converted to an n-bit signal in which all the bits are "1." If the output from the delay element 10,3 is "+1," on the other hand, it is converted to an n-bit signal in which only the least significant bit is "1" and the other bits are "0." The delay element 10,2 outputs the output (predicted value) from the adder 11,2 after delaying it for a given period of time. The adder 11,2 adds up the signal obtained by reducing, to n, the number of bits of the output from the delay element 10,3 and the output (output result from the adder 11,2 obtained in the preceding step) from the delay element 10,2. In other words, the adder 11,2 generates a predicted value for the input signal by integrating the output from the quantizer 12.

Figure 2B:
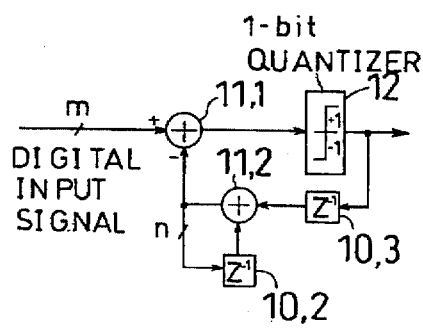
FIG. 2(b) is a signal wire diagram of a delta-type modulator constituting a part of the interpolative modulator of the first embodiment.
Figure 2C:
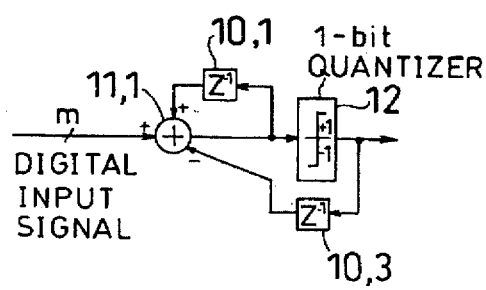
FIG. 2(c) is a signal wire diagram of a delta-sigma-type modulator constituting a part of the interpolative modulator of the first embodiment.

The delta-sigma-type modulator of FIG. 2(c) is for modulating the quantizing noise. In the delta-sigma modulator are shown: the first delay element 10,3; the third delay element 10,1; the adder 11,1; and the 1-bit quantizer 12. The quantizer 12 receives the output signal from the adder 11,1 and outputs "+1" if the signal value is positive or "−1" if the signal value is negative, thereby representing the output signal from the adder 11,1 in one of the two values. The delay element 10,3 outputs the output from the above quantizer 12 after delaying it for a given period of time in accordance with the clock for delay element. The delay element 10,1 outputs the output (difference signal to be described later) from the above adder 11,1 after delaying it for a given period of time in accordance with the clock for delay element. The adder 11,1 subtracts, from the digital input signal, the output (output result from the quantizer 12 obtained in the preceding step) from the delay element 10,3, while adding up the difference signal thereof and the output (difference signal obtained in the preceding step) from the delay element 10,1, so as to output the difference signal.

Since the above interpolative modulator 1 of FIG. 2(a) is a combination of the structures of FIGS. 2(b) and 2(c), the predicted value from the adder 11,2 is feedbacked to the adder 11,1 such that the difference signal of the digital input signal X and predicted value is reduced in number of bits. On the other hand, the first-order delta-sigma modulation is performed with respect to the difference signal, so that the digital output signal having a smaller number of bits (n bits) is obtained from the output of the delay element 10,2.

Since the adder 11,2 adds up the output result (output from the delay element 10,2) from the adder 11,2 obtained in the preceding step and one of "+1" and "−1" output from the quantizer 12, it will be understood that, in the interpolative modulation, the output signal Y varies from the output signal Y obtained in the preceding step by only ±1.

The interpolative modulator 1 of FIG. 2 is different from the conventional interpolative modulator 1 of FIG. 17 in that all the bits other than the least significant bit of the signal shown in FIG. 6, which is obtained by reducing, to n, the number of bits of the output signal (the signal having the value of +1 or −1 from the quantizer 12, which varies, with one clock, by a specified step voltage toward positive voltages or toward negative voltages) from the first delay element 10,3, form the shift-direction control signal to the bidirectional shift register 2. The shift clock for delay element generated at given time intervals is used as the shift clock to the bidirectional shift register 2.

Figure 3:
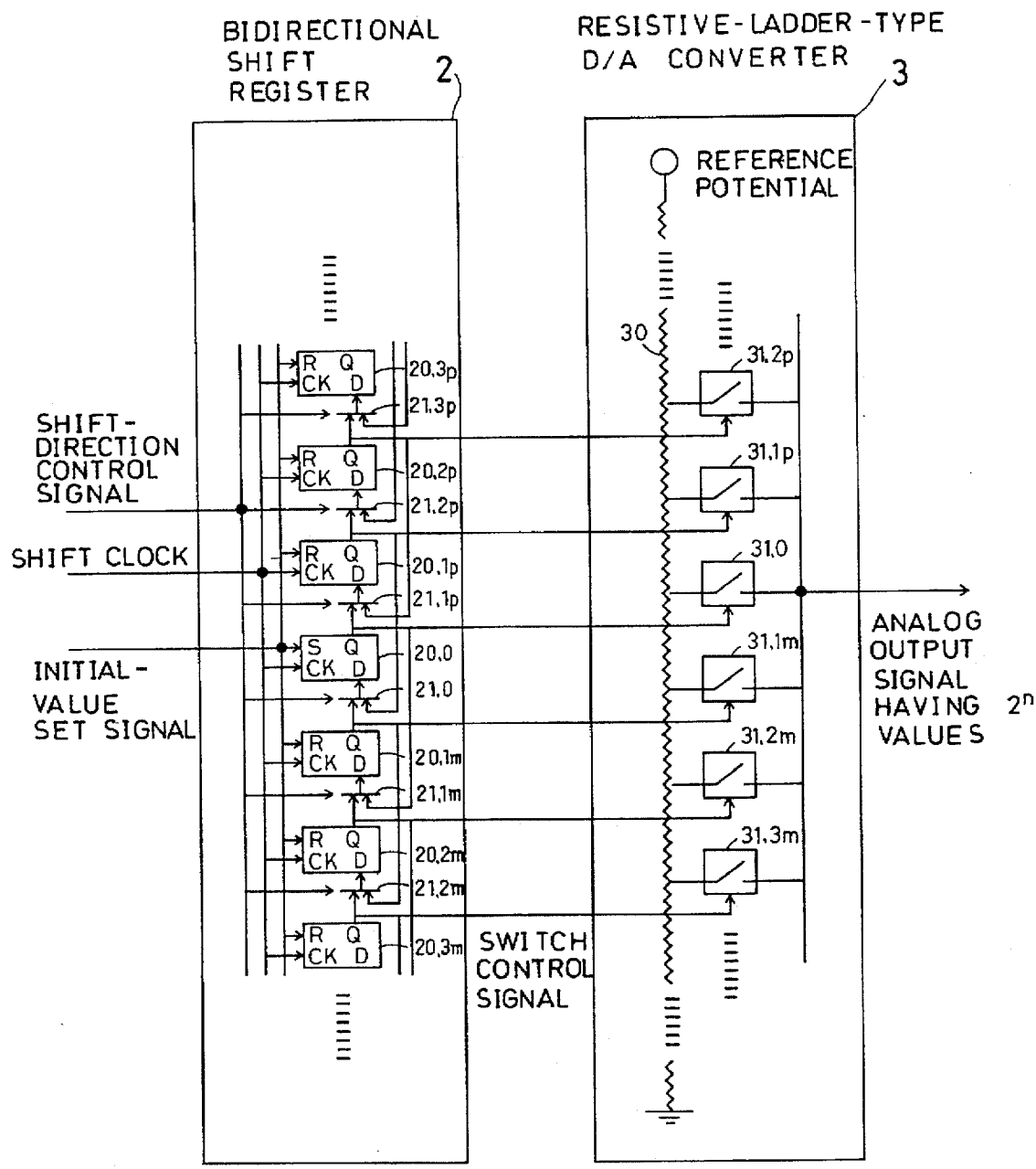
FIG. 3 is a view showing an example of the circuit of a bidirectional shift register and a resistive-ladder-type D/A converter of the first embodiment.

FIG. 3 is a detailed circuit diagram of the bidirectional shift register 2 and of the resistive-ladder-type D/A converter 3.

The bidirectional shift register 2 in the drawing consists of: $2^n$ registers $20,0$ $20,1p$ to $20,3p$, and $20,1m$ to $20,3m$; and $2^n$ selectors $21,0.$ $21,1p$ to $21,3p$, and $21,1m$ to $21,3m$. The register $20,3m$ is in the first stage, while the register $20,3p$ is in the final stage.

Each of the above registers $20,0$ to $20,3m$ has a clock input terminal CK, a data input terminal D, and a data output terminal Q. The register $20,0$ in the middle stage has a set terminal S, while the other registers $20,1p$ to $20,3m$ have their respective reset terminals R. To the input terminal CK of each of the registers is input the shift clock from the above interpolative modulator 1. To the set terminal S of the register $20,0$ in the middle stage and to the respective reset terminals R of the other registers is input the initial-value set signal (coincidence detect signal) from the above specified data detector 4.

Each of the above selectors $21,0$ to $21,3m$ of the bidirectional shift register 2 is interposed between the corresponding two adjacent ones of the above registers $20,0$ to $20,3m$ and receives both signals from the signal output terminals Q of the corresponding two adjacent registers positioned in the subsequent and previous stages (lower and upper stages in the drawing). Each of the above selectors receives the shift-direction control signal from the above selects, if the shift-direction control signal has the value "+1," the signal from the signal output terminal Q of the register positioned in the previous stage or selects, if the shift-direction control signal has the value "−1," the signal from the signal output terminal Q of the register positioned in the subsequent stage. The output signal from each of the above selectors $21,0$ to $21,3$ is input to the signal input terminal D of the register positioned in the subsequent stage.

Figure 5:
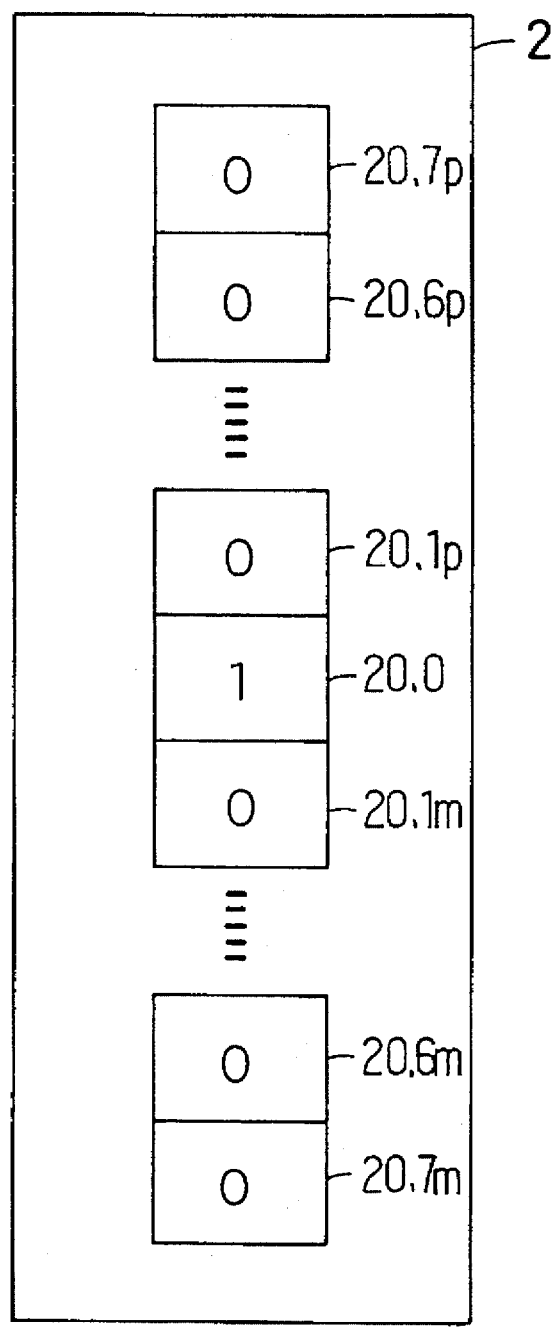
FIG. 5 is a view showing an example of the initialization of the bidirectional register of the first embodiment.

The initial value of the above bidirectional shift register 2 is set by an initial-value setting means shown in FIG. 5. In the bidirectional shift register 2 of FIG. 3, the initial-value setting signal (to be described later) output from the specified data detector 4 sets only the register $20,0$, while it resets the other registers. Accordingly, only the register $20,0$ in the middle stage outputs a HIGH signal in initialization. Subsequently, in synchronization with the inputting of the shift clock, the register in the previous or subsequent stage in turn outputs a HIGH signal in accordance with the value of the shift-direction control signal from the interpolative modulator 1. The above process goes on so that, apparently, the register outputting a HIGH signal shifts its position either upward or downward by one stage at a time upon each inputting of the shift clock. Therefore, only one of all the registers constituting the bidirectional shift register 2 outputs a HIGH signal in the bidirectional shift register 2.

Figure 18:
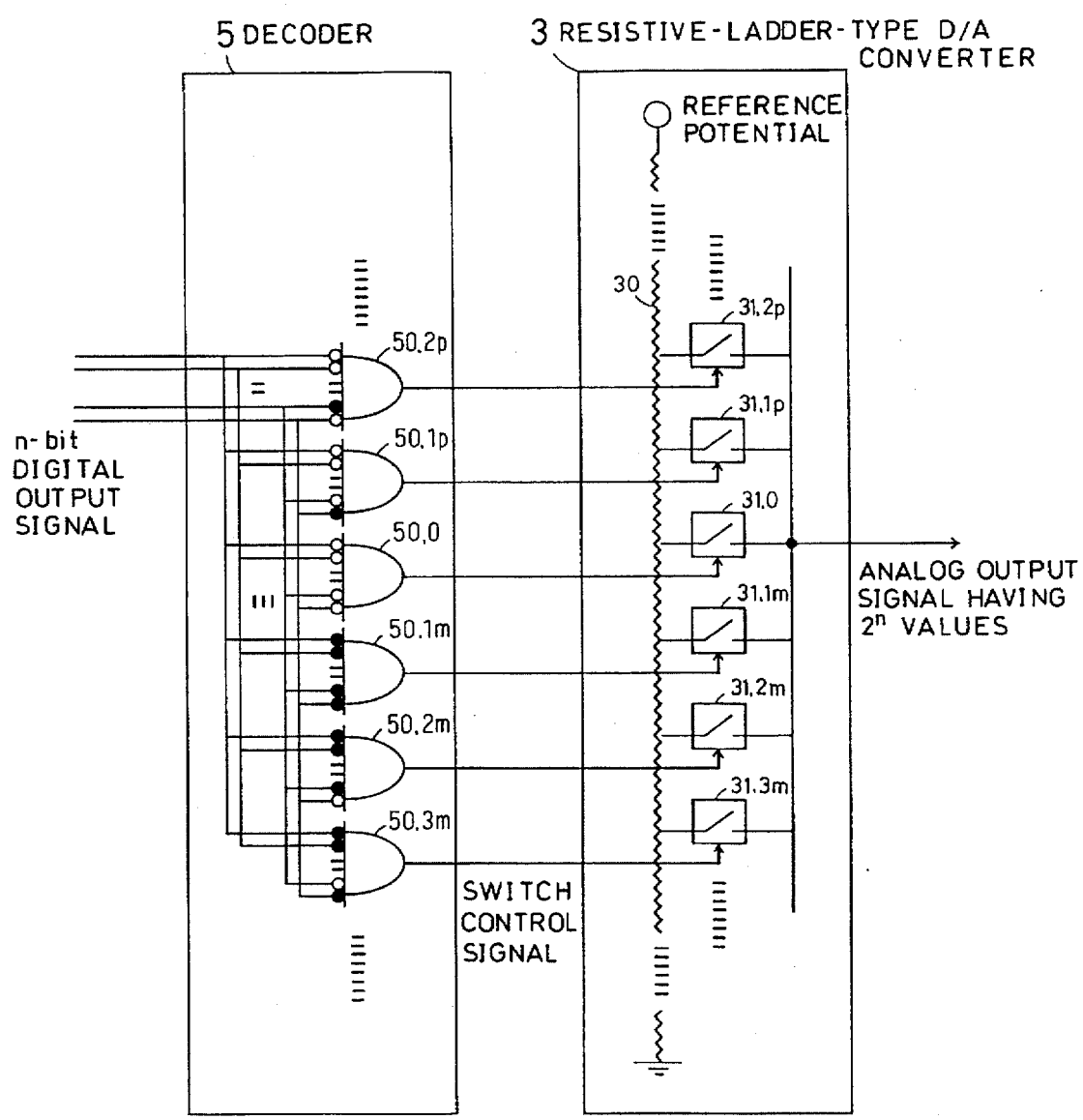
FIG. 18 is a view showing a specific circuit of a conventional decoder and a conventional resistive-ladder-type D/A converter.

The resistive-ladder-type D/A converter 8 is of voltage-potentiometer type, which is the same as the conventional structure described above with reference to FIG. 18, so that it consists of: a resistor 30; and switches $31,0$, $31,1p$ to $31,2p$, and $31,1m$ to $31,3m$. The switches have their respective one ends connected to individual potentials obtained by dividing a reference potential with the resistor such that only the potential connected to the switch that has been turned ON is output as the analog output signal. The control signals for turning ON and OFF the individual switches $31,0$, $31,1p$ to $31,2p$, and $31,1m$ to $31,3m$ are composed of the outputs from the corresponding registers $20,0$, $20,1p$ to $20,3p$, and $20,1m$ to $20,3m$ of the bidirectional shift register 2.

Figure 4:
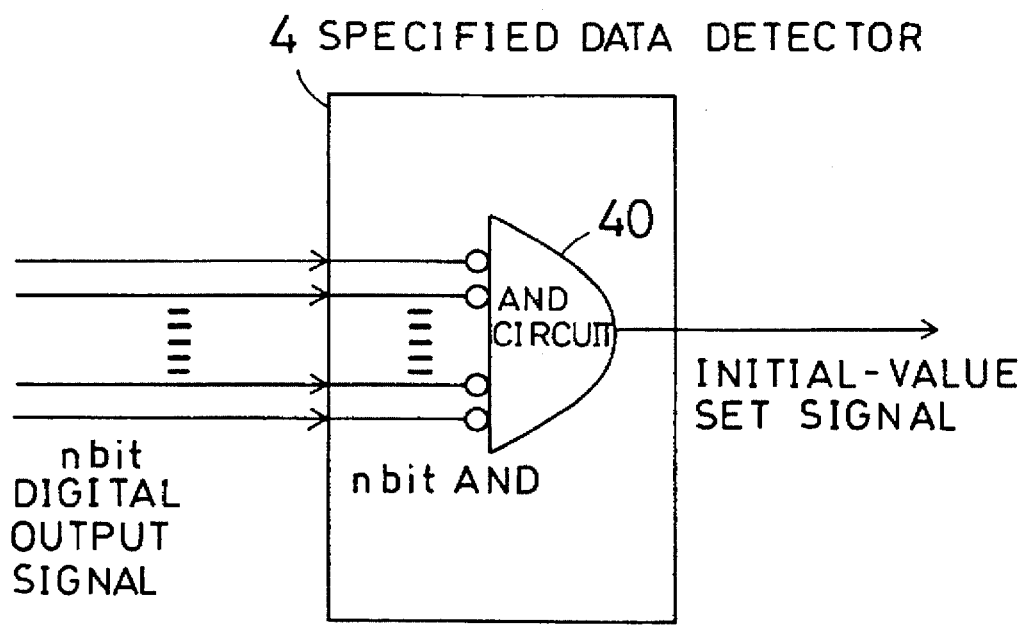
FIG. 4 is a view showing an example of the circuit of a specified data detector of the first embodiment.

FIG. 4 shows an example of the circuit of the specified data detector 4. In the drawing is shown an n-bit-input AND circuit 40, which outputs a HIGH signal only when all its inputs have the value "0". In other words, it is a circuit for detecting the time at which the n-bit digital output signal having a smaller number of bits from the interpolative modulator 1 coincides with the value "0" and outputting a HIGH signal (coincidence detect signal).

Below, the principle of operation of the present embodiment will be described with reference to FIGS. 1 to 5.

The n-bit digital output signal Y output from the interpolative modulator 1 varies, with one clock, by only the output from the delay element 10,3. In other words, the variation in the n-bit digital output signal Y with one clock is only ±1. On the other hand, a signal having the value of +1 or −1 can be represented by 1 bit and the output signal from the delay element 10,3 can be given as the shift-direction control signal to the bidirectional shift register. Here, it is assumed that, if the output from the delay element 10,3 is HIGH, data is shifted upward in the bidirectional shift register in FIG. 3 and, if the output from the delay element 10,3 is LOW, data is shifted downward in the bidirectional shift register in FIG. 3. Since the data shift clock is identical with the data clock for delay element, data shifting between the registers is performed in synchronization with the data clock for delay element. On the other hand, the specified data detector 4 detects a coincidence between data represented by the digital output Y from the interpolative modulator 1 and the specified data of 0. If 0 was detected, the respective registers of the bidirectional shift register 2 are initialized. With the above operation, it becomes possible for the resistive-ladder-type D/A converter 3 to output a potential corresponding to the value of the digital output Y from the interpolative modulator 1.

Even when the digital output signal Y from the interpolative modulator 1 varies, i.e., even when the value of the shift-direction control signal changes to "+1" or to "−1," the register outputting a HIGH signal in the bidirectional shift register 2 only shifts its position to its higher or lower stage. Consequently, even if a delay difference exists between the transition of one of the above two adjacent registers from HIGH to LOW and the transition of the other register from LOW to HIGH due to the parasitic capacitance of wires along which the shift-direction control signal is input to the respective registers, the output potential of the resistive-ladder-type D/A converter 3 will continuously vary, which process will be described below in greater detail.

FIGS. 7(a), 7(b), and 7(c) are views each showing the transition of the number of the switch which was selected inside the resistive-ladder-type D/A converter 3 (selected switch number) based on the output from the bidirectional shift register 2 when the digital output signal Y from the interpolative modulator 1 varied (for convenience, the selected switch number of the switch $31,0$ in the middle stage is designated as "0," the switch number of the switch $31,1p$ in the previous stage is designated as "+1," and the switch number of the switch $31,1m$ in the subsequent stage is designated as "−1."

In FIGS. 7(a), 7(b), and 7(c), the number of bits n of the n-bit digital signal Y from the interpolative modulator 1 of FIG. 2 has been set to 4. FIG. 7(a) shows the ideal case where, in the bidirectional shift register 2, the time required by the output from a register that should output a HIGH signal to rise from "0" to "1" is equal to the time required by the output from a register that should output a LOW signal to fall from "1" to "0." FIG. 7(b) shows the case where the time required by the output from the register that should output a LOW signal to fall from "1" to "0" is longer than the time required by the output from the register that should output a HIGH signal to rise from "0" to "1." FIG. 7(c) shows the case where the time required by the output from the register that should output a LOW signal to rise from "0" to "1" is longer than the time required by the output from the register that should output a HIGH signal to fall from "1" to "0."

In the ideal case shown in FIG. 7(a), when the 4-bit digital signal data from the interpolative modulator 1 shifts from "0" to "−1," the selected switch number also shifts from "0" to "−1."

In FIG. 7(b), however, when the 4-bit digital signal data from the interpolative modulator 1 shifts from "0" to "−1," the selected switch number becomes each of "0" and "−1" and then becomes only "−1." In FIG. 7(c), after the state was reached in which there was no selected switch number (the state in which no register was outputting a HIGH signal), the selected switch number becomes only "−1."

Although the glitch occurred in the case where there was a delay difference between the respective bits in the conventional oversampling D/A converter, adjacent switches are simply selected simultaneously in the structure of the present embodiment. In the above case of FIG. 7(b), the analog output potential from the resistive-ladder-type D/A converter 3 becomes an intermediate potential between the current potential and the potential to be achieved after a transition, as shown in FIG. 7(d). In the above case of FIG. 7(c), on the other hand, the analog output potential from the resistive-ladder-type D/A converter 3 is brought into a high-impedance state and hence holds its current potential, as shown in FIG. 7(e). Consequently, the output potential varies continuously in each of the cases of FIG. 7(b) and FIG. 7(c).

Hence, the present embodiment can provide an oversampling D/A converter with high accuracy and with an increased yield.

It is also possible to set the amount of offset to an arbitrary value by changing, by means of the specified data detector 4, the number of the register to be initially set in the bidirectional shift register 2.

(Second Embodiment)

Figure 8:
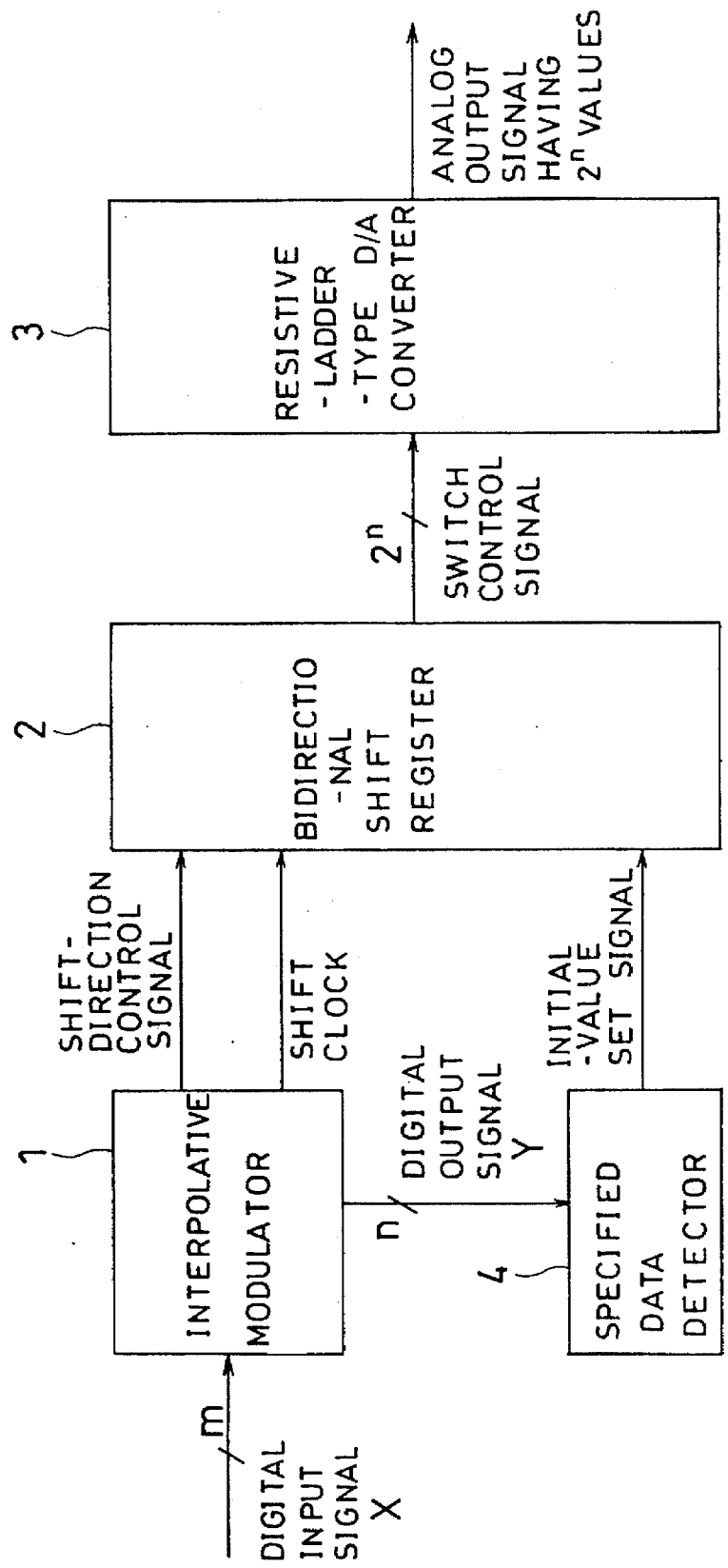
FIG. 8 is a view showing the overall structure of a D/A converter according to a second embodiment.

FIG. 8 shows a second embodiment of the present invention. The overall structure of the present embodiment is similar to that of the above first embodiment, except for the internal structure of the interpolative modulator. In the interpolative modulator 1 of the first embodiment, the 1-bit quantizer 12 represents the output from the adder 11,1 in one of the two values "+1" or "−1", while, in an interpolative modulator 1' of the present embodiment, a 2-bit quantizer 12' represents the output from the adder 11,1 in one of the three values "+1," "0," and "−1."

Figure 9:
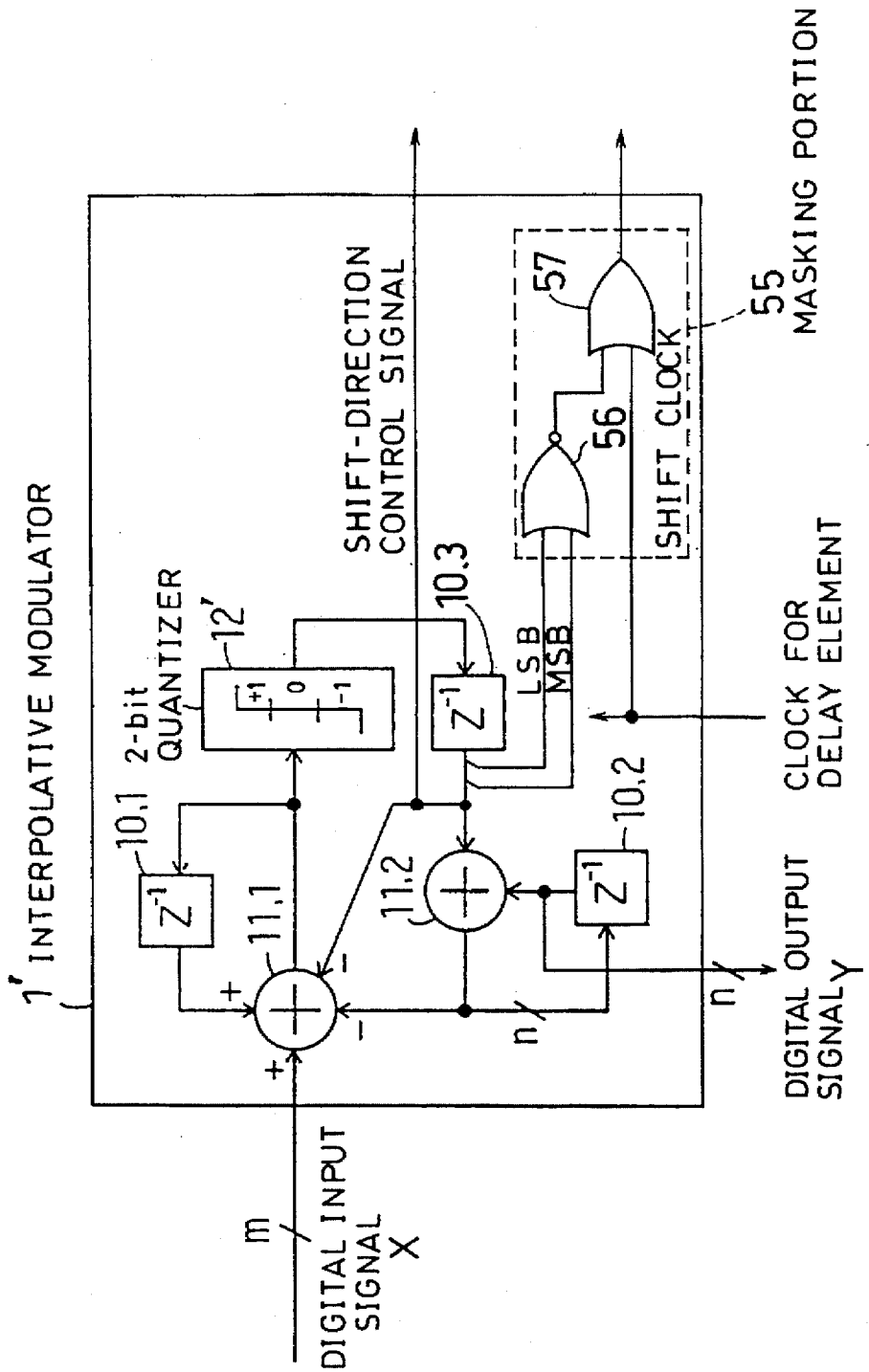
FIG. 9 is a signal wire diagram of an interpolative modulator of the second embodiment.

In the interpolative modulator 1' shown in FIG. 9, the system function Y(z) is represented by the following equation (2):

$$Y(z)=X(z)+(1-z^{-1})*(\tfrac{1}{2})*Q(z) \quad (2)$$

By comparison with the system function Y(z) represented by the above equation (1) for the interpolative modulator 1 of FIG. 1, it will be appreciated that the quantizing noise Q has been halved in the interpolative modulator 1' of FIG. 9.

Hence, in the present embodiment, the total amount of quantizing noise can be almost halved when the amplitude of the input signal is small or when the frequency of the input signal is low.

When the value of the output from the above quantizer 12' is "0," i.e., when the value of the shift-direction control signal is "0," it is necessary to mask the shift clock, since the register outputting a HIGH signal in the bidirectional shift register 2 is required to continue outputting a HIGH signal. The interpolative modulator 1' is provided with an additional masking portion 55 for performing the function.

Figure 10:
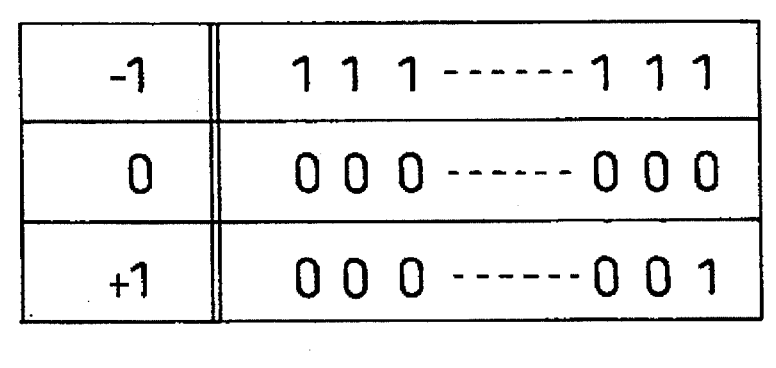
Figure 11:
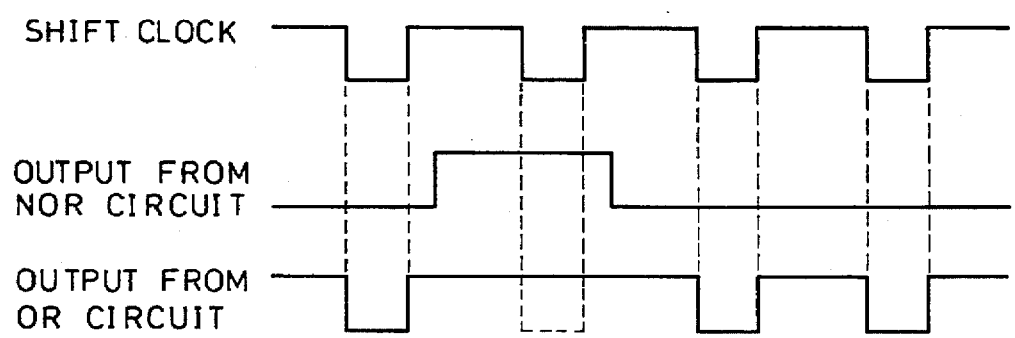
FIG. 11 is a view for illustrating the operation of a masking portion of the second embodiment.

As shown in FIG. 9, the above masking portion 55 consists of: an NOR circuit 56; and an OR circuit 57. The above NOR circuit 56 becomes HIGH on receiving a total of two bits, which are the least significant bit and a bit other than the least significant bit from the signal shown in FIG. 10, which was obtained by reducing, to n, the number of bits of the output signal from the delay element 10,3 (signal having the value "0" from the quantizer 12). The above OR circuit 57 receives the output from the above NOR circuit 56 and the shift clock. Consequently, as shown in FIG. 11, when the output signal from the delay element 10,3 has the value "0", the output from the NOR circuit 56 and the output from the OR circuit 57 become HIGH, so that the masking portion 55 masks the shift clock at this time.

(Variation of Bidirectional Shift Register)

Figure 12:
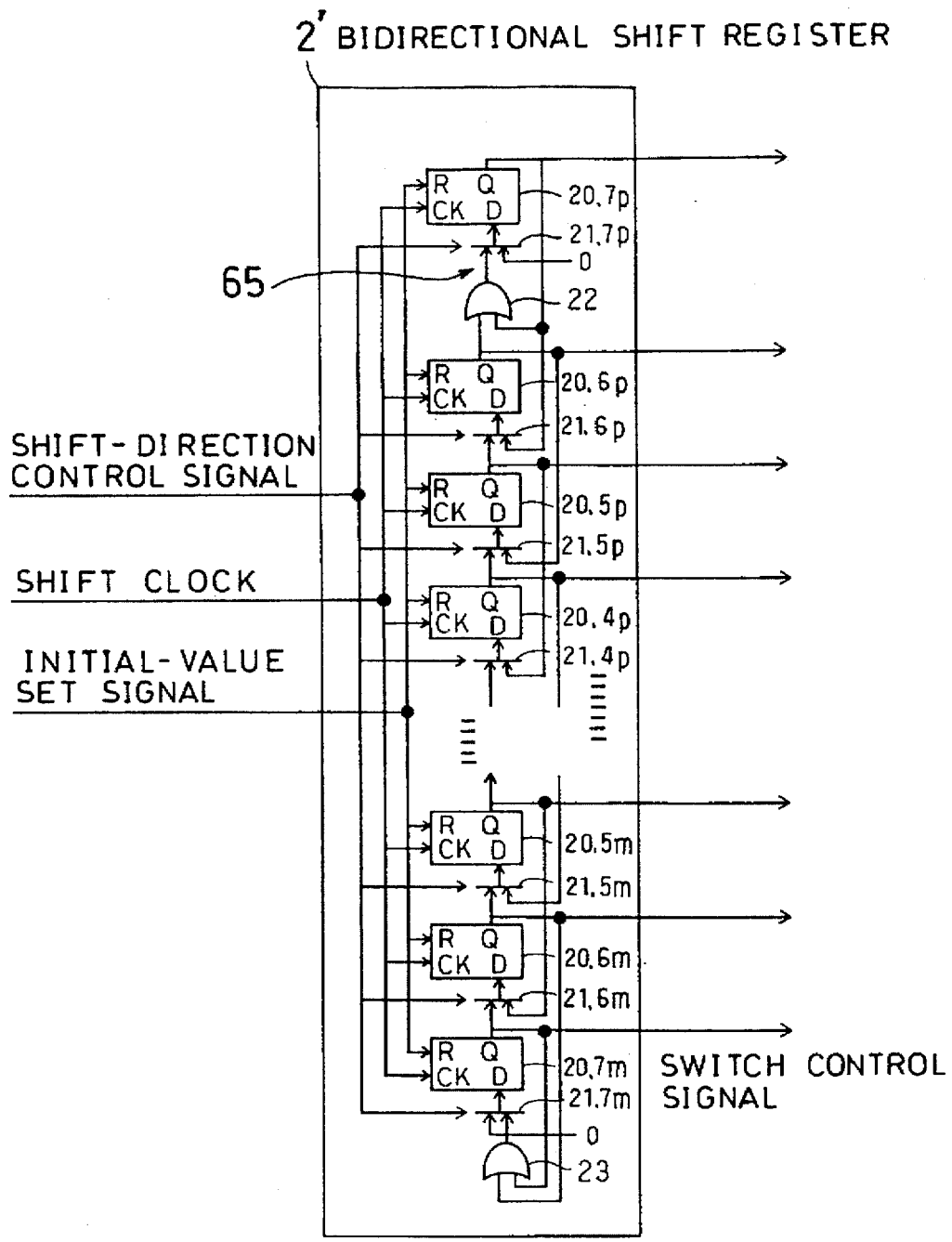
FIG. 12 is a circuit diagram showing a variation of the bidirectional shift register.

FIG. 12 shows a variation of the bidirectional shift register 2. With the structure shown in the drawing, the upper and lower limits of the bidirectional shift register 2 can be fixed, i.e., the range of the output voltages of the analog output potential can be restrained.

The bidirectional shift register 2' of FIG. 12 consists of: a total of fifteen registers 20,0, 20,1p to 20,7p, and 20,1m to 20,7m; selectors; 21,0, 21,1p to 21,7p, and 21,1m to 21,7m; and a first OR circuit (first logic circuit) 22; and a second OR circuit (second logic circuit) 23. Of the fifteen registers, the registers 20,1p to 20,7P are positioned in the seven upper stages, while the registers 20,1m to 20,7m are positioned in the seven lower stages, with the register 20,0 (not shown in FIG. 12) positioned in the middle stage.

The above first OR circuit 22 receives data from the output terminal Q of the register 20,7p in the final stage and data from the output terminal Q of the register 20,6p in the stage previous to the final stage and performs the logical OR operation between the two sets of data. The second OR circuit 23 receives data from the output terminal Q of the register 20,7m in the first stage and data from the output terminal Q of the register 20,6m in the stage subsequent to the first stage and performs the logical OR operation between the two sets of data.

The selector 21,7p corresponding to the register 20,7p positioned in the final stage receives the output from the above first OR circuit 22 and a "0" signal, selects the output from the first OR circuit 22 if the value of the shift-direction control signal is "+1" or selects the "0" signal if the value of the shift-direction control signal is "−1," and outputs the selected data to the input terminal D of the register 20,7p positioned in the final stage.

The selector 21,7m corresponding to the register 20,7m positioned in the first stage receives the output from the above second OR circuit 23 and the "0" signal, selects the above "0" signal if the value of the shift-direction control signal is "+1" or selects the output from the second OR circuit 23 if the value of the shift-direction control signal is "−1," and outputs the selected data to the input terminal D of the register 20,7m positioned in the first stage.

The above first and second OR circuits 22 and 23 and the selectors 21,7m and 21,7p in the first and final stages constitute a data maintenance circuit 65.

In the above structure, if data is input to the register 20,7p in the final stage from the register 20,6p positioned in the previous stage, the logical sum between the output from the register 20,7p in the final stage and the output from the register 20,6p in the previous stage is input to the input terminal D of the register 20,7p in the final stage. Conversely, if data is input from the register 20,7p in the final stage to the register 20,6p in the previous stage, "0" is input to the input terminal D of the register 20,7p in the final stage. The same shall apply to the register 20,7m in the first stage. If data is input to the register 20,7m in the first stage from the register 20,6m in the subsequent stage, the logical sum between the output from the register 20,7m in the first stage and the output from the register 20,6m in the subsequent stage is input to the input terminal D of the register 20,7m in the first stage. Conversely, if data is input from the register 20,7m in the first stage to the register 20,6m in the subsequent stage, "0" is input to the input terminal D of the register 20,7m in the first stage. Consequently, in the case where the HIGH output of the shift data is placed on the both ends of the bidirectional shift register 2, if the output from the register 20,7p in the final stage is HIGH, e.g., even when data is being input to the register 20,7p in the final stage from the register 20,6p in the previous stage (when the output from the register 20,6p is LOW), the output from the OR circuit 22 becomes HIGH and the output value (HIGH) from the register 20,7p in the final stage does not become LOW. The same shall apply to the register 20,7m in the first stage.

Thus, in the resistive-ladder-type oversampling D/A converter using the bidirectional shift register 2' shown in FIG. 12, even when the register 20,7p or 20,7m positioned in the final or first stage of the bidirectional shift register 2' is holding data and data shift to the register in the subsequent or previous stage is requested, the register 20,7p or 20,7m in the final or first stage continues holding data, so that there is no possibility that all the switches of the resistive-ladder-type D/A converter 3 are turned OFF.

Figure 13A:
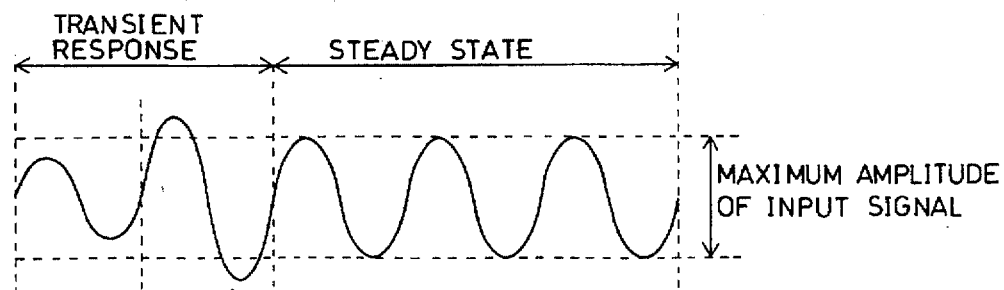
FIG. 13(a) is a view showing an input waveform in the transient response.
Figure 13B:
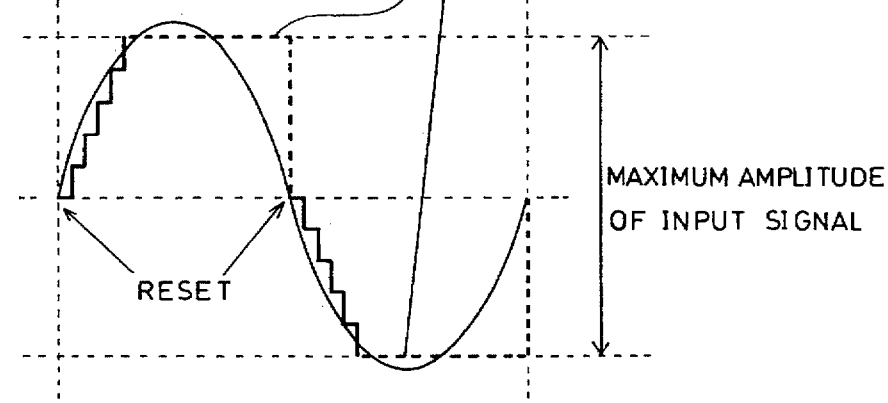
FIG. 13(b) is a view showing an output waveform from the D/A converter without measures.
Figure 13C:
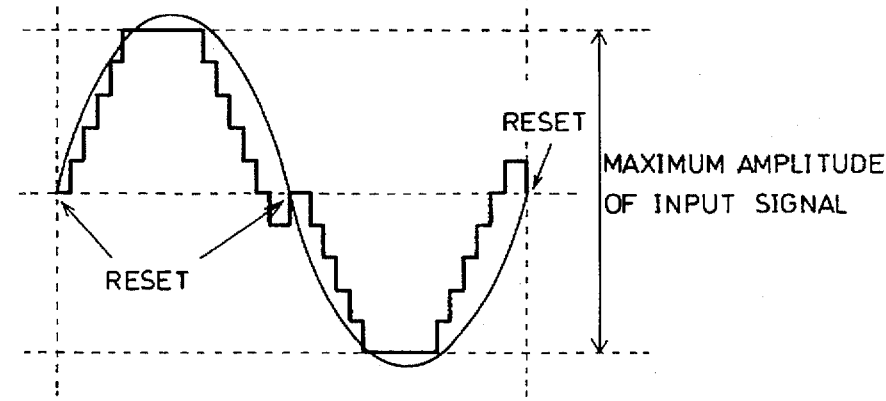
FIG. 13(c) is a view showing the output waveform from the D/A converter with measures.

In the resistive-ladder-type D/A converter 3, in particular, there are some cases where the original amplitude of the input signal is increased due to a transient response of the interpolative modulator or of a digital filter for producing an oversampled digital input signal shown in FIG. 13(a). However, in the case where the width of data shift (number of constituent registers) in the bidirectional shift register is precisely as large as the maximum amplitude of a regular input signal, if the amplitude is exceeded, there will be no register outputting a HIGH signal among the group of registers constituting the shift register. As a result, the output from the D/A converter becomes a high impedance node, the output from which is undefined and susceptible to noise. With the bidirectional shift register 2' of the present variation of FIG. 12, however, even when the maximum amplitude of the input signal is exceeded, one of the group of registers constituting the shift register is always outputting a HIGH signal so that the output from the D/A converter never becomes the high impedance node as shown in FIG. 13(c).

Although a distortion is observed at the zero crossing in the bidirectional shift register 2' of FIG. 12, the distortion is observed only in the case of the transient response and hence does not present a problem in the steady (stable) state.

When the improved bidirectional shift register 2' is used in a D/A converter which does not necessitate a significantly large S/N ratio at an increased amplitude, even if a reduced number of registers are intentionally provided therein to reduce circuit size, the provision of a small number of additional elements (i.e., the provision of the two additional OR circuits) achieves the above effect.

(Variation of Modulator)

Figure 14:
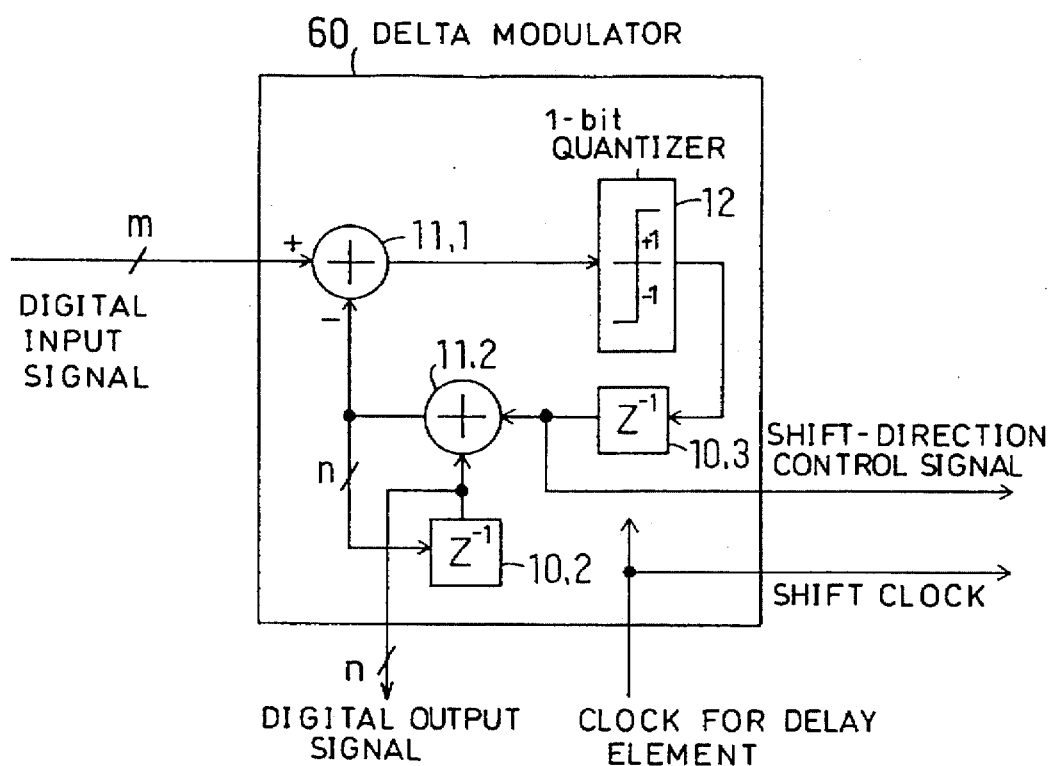
FIG. 14 is a view showing a specific structure of a delta modulator, which is a variation of the modulator.

FIG. 14 shows a variation in which a delta modulator 60 is provided in place of the interpolative modulator 1 shown in FIGS. 1 and 2.

In the present variation, the delta modulator is provided in place of the interpolative modulator 1 of the above first embodiment, since the present invention is applicable to any D/A converter provided that it uses a modulation technique with which the output from the modulator varies within the range of ±1. The delta modulator 60 of FIG. 14 is different from the interpolative modulator shown in FIG. 2 only in that the delay element 10,1 is not provided and that no signal is output from the delay element 10,3 to the adder 11,1.

(Another Variation of Modulator)

Figure 15:
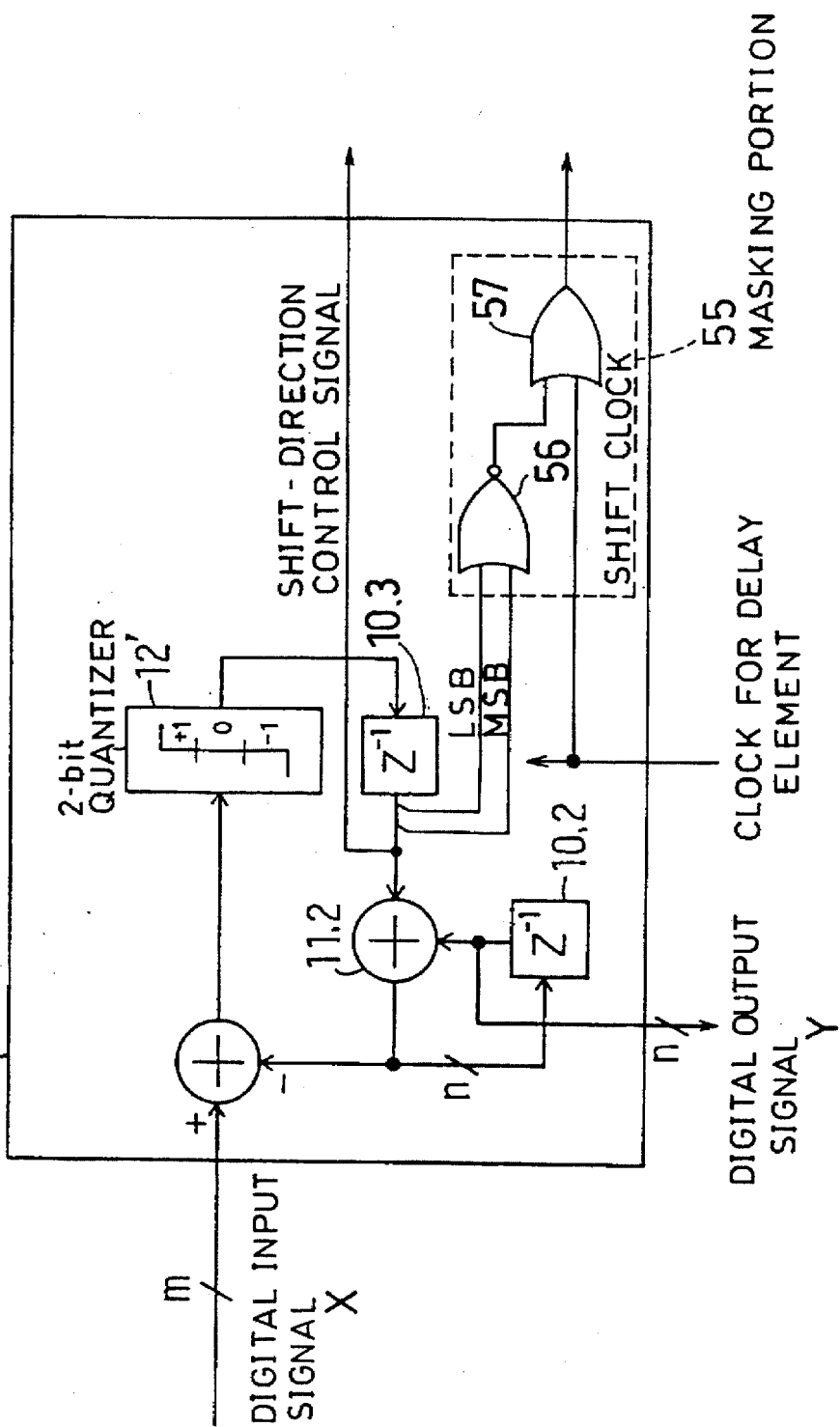
FIG. 15 is a view showing a specific structure of another delta modulator, which is another variation of the modulator.
Figure 16:
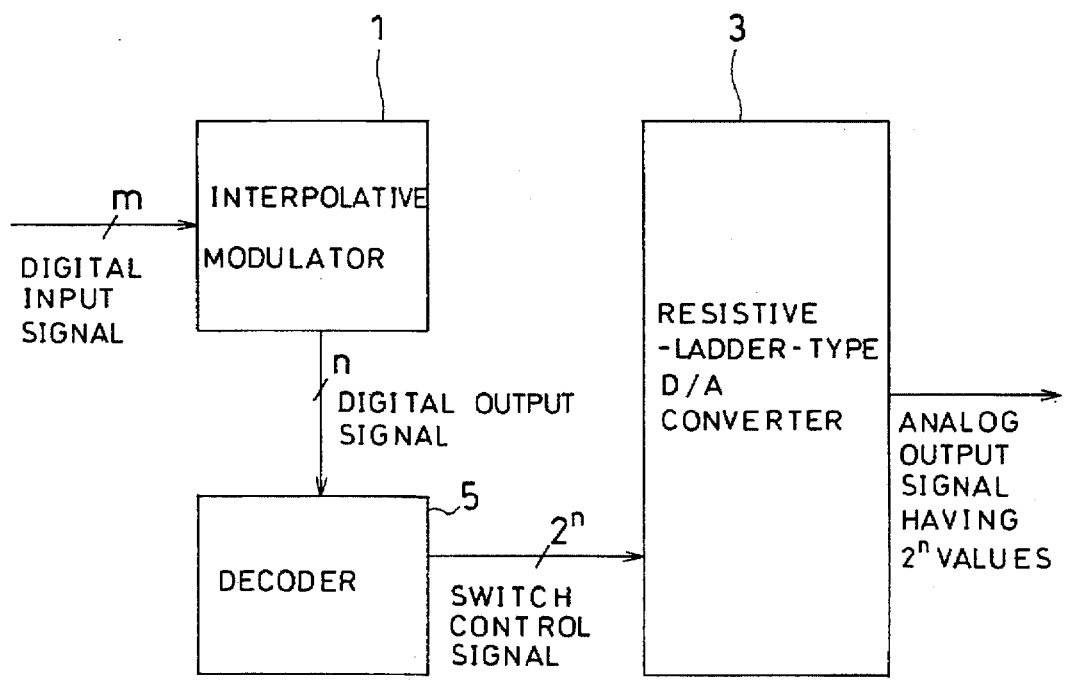
FIG. 16 is a view showing the overall structure of a conventional D/A converter.

FIG. 15 shows a variation of the delta modulator 60 shown above in FIG. 14.

In the present variation, the 2-bit quantizer 12' of the interpolative modulator 1' of the above second embodiment is provided in place of the 1-bit quantizer 12 of the delta modulator 60 of FIG. 14. Consequently, the total amount of quantizing noise of the present variation is substantially one-half of that of the variation of FIG. 14.

Although the signal output unit has been constituted by one of the interpolative modulators 1 and 1', by the delta modulator 60, or by a delta modulator 61 which is a variation of the delta modulator 60 in the foregoing description, the signal output unit may be constituted by another structure instead of the interpolative modulators and delta modulators. In the case where there is an interpolative filter for performing linear interpolation of data at a plurality of points between two sampling points, e.g., if the output from the interpolative filter varies only by "+1" or "−1," it is possible to constitute the signal output unit by the interpolative filter.

Although the output potential selector has been constituted by the resistive-ladder-type D/A converter of voltage-potentiometer type in the foregoing description, it will easily be appreciated that the output potential selector may be constituted by a resistive-ladder-type D/A converter of R-2R type.

We claim:

1. An oversampling D/A converter comprising:

a signal output unit for receiving a digital signal and outputting a digital signal the value of which varies, with one clock, by a specified step voltage toward positive voltages or toward negative voltages, depending on a variation in the input signal;

a bidirectional shift register having a plurality of registers being juxtaposed, said bidirectional shift register receiving an output signal from said signal output unit and using it as a data-shift-direction control signal, while repeatedly receiving a data shift clock at given time intervals and shifting data, on each receipt of the data shift clock, to the register in a previous or subsequent stage, depending on a value of said data-shift-direction control signal; and an output potential selector for selecting, in accordance with outputs from the respective registers of said bidirectional shift register, one of a plurality of potentials obtained by dividing a difference between a first reference potential and a second reference potential with a resister interposed therebetween.

2. An oversampling D/A converter according to claim 1, wherein the signal output unit is composed of an oversampling interpolative modulator, said interpolative modulator including:

a quantizer for quantizing a signal input thereto into one of two values of +1 and −1, depending on a value of the signal, and functioning as:

a delta-sigma modulator for modulating quantized noise resulting from the quantization by said quantizer; and a delta modulator for obtaining a predicted value corresponding to the digital input signal and quantizing a difference signal representing a difference between the predicted value and a value of said digital input signal.

3. An oversampling D/A converter according to claim 1, wherein the signal output unit is composed of an oversampling interpolative modulator, said interpolative modulator including:

a quantizer for quantizing a signal input thereto into one of three values of +1, 0, and −1, depending on a value of the signal, and functioning as:

a delta-sigma modulator for modulating quantized noise resulting from the quantization by said quantizer; and a delta modulator for obtaining a predicted value corresponding to the digital input signal and quantizing a difference signal representing a difference between the predicted value and a value of said digital input signal.

4. An oversampling interpolative modulator according to claim 2, wherein the oversampling interpolative modulator consists of first and second adders, first, second, and third delay elements, and the quantizer, said quantizer quantizing an output from said first adder into one of the two values of +1 and −1, depending on a value of the output, said first delay element delaying an output from said quantizer by a specified period of delay time, said second delay element delaying an output from said second adder by the specified period of delay time, said second adder adding up respective outputs from said first and second delay elements and calculating a predicted value for the digital input signal, said third delay element delaying the output from said first adder by the specified period of delay time, said first adder adding up the digital input signal, a signal having the same absolute value as the output from said first delay element and a sign opposite to a sign of the output from said first delay element, an output from said third delay element, and a signal having the same absolute value as the output from said second adder and a sign opposite to a sign of the output from said second adder.

5. An oversampling D/A converter according to claim 3, wherein the oversampling interpolative modulator consists of first and second adders, first, second, and third delay elements, and the quantizer, said quantizer quantizing an output from said first adder into one of the three values of +1, 0, and −1, depending on a value of the output, said first delay element delaying an output from said quantizer by a specified period of delay time, said second delay element delaying an output from said second adder by the specified period of delay time, said second adder adding up respective outputs from said first and second delay elements and calculating a predicted value for the digital input signal, said third delay element delaying the output from said first adder by the specified period of delay time, said first adder adding up the digital input signal, a signal having the same absolute value as the output from said first delay element and a sign opposite to a sign of the output from said first delay element, an output from said third delay element, and a signal having the same absolute value as the output from said second adder and a sign opposite to a sign of the output from said second adder.

6. An oversampling D/A converter according to claim 1, wherein the signal output unit is composed of an oversampling delta modulator, said modulator having a quantizer for quantizing a signal into one of two values of +1 and −1, depending on a value of the signal, obtaining a predicted value corresponding to the digital input signal, and quantizing, by means of said quantizer, a difference signal representing a difference between the predicted value and a value of said digital input signal.

7. An oversampling D/A converter according to claim 1, wherein the signal output unit is composed of an oversampling delta modulator, said modulator having a quantizer for quantizing a signal into one of three values of +1, 0, and −1, depending on a value of the signal, obtaining a predicted value corresponding to the digital input signal, and quantizing, by means of said quantizer, a difference signal representing a difference between the predicted value and a value of said digital input signal.

8. An oversampling D/A converter according to claim 6, wherein the oversampling delta modulator consists of first and second adders, first and second delay elements, and the quantizer, said quantizer quantizing an output from said first adder into one of the two values of +1 and −1, depending on a value of the output, said first delay element delaying an output from said quantizer by a specified period of delay time, said second delay element delaying an output from said second adder by the specified period of delay time, said second adder adding up respective outputs from said first and second delay elements and calculating a predicted value for the digital input signal, said first adder adding up the digital input signal and a signal having the same absolute value as the output from said second adder and a sign opposite to a sign of the output from said second adder.

9. An oversampling D/A converter according to claim 7, wherein the oversampling delta modulator consists of first and second adders, first and second delay elements, and the quantizer, said quantizer quantizing an output from said first adder into one of the three values of +1, 0, and −1, depending on a value of the output, said first delay element delaying an output from said quantizer by a specified period of delay time, said second delay element delaying an output from said second adder by the specified period of delay time, said second adder adding up respective outputs from said first and second delay elements and calculating a predicted value for the digital input signal, said first adder adding up the digital input signal and a signal having the same absolute value as the output from said second adder and a sign opposite to a sign of the output from said second adder.

10. An oversampling D/A converter according to claim 4 or 8, wherein each of the delay elements repeatedly receives a clock for delay element and is activated on each receipt of the clock for delay element, said clock for delay element being input as the shift clock to the bidirectional shift register.

11. An oversampling D/A converter according to claim 5 or 9, wherein each of the delay elements repeatedly receives a clock for delay element and is activated on each receipt of the clock for delay element, said oversampling D/A converter further comprising an additional masking portion for receiving said clock for delay element and selectively masking the clock for delay element if the first delay element outputs the value of 0 or not masking the clock for delay element if the first delay element outputs the value of +1 or −1, said clock for delay element from said masking portion being input as the shift clock to the bidirectional shift register.

12. An oversampling D/A converter according to claim 11, wherein the masking portion consists of:

an NOR circuit for receiving a total of 2 bits of the signal consisting of a plurality of bits from the first delay element, said 2 bits being a least significant bit and a bit other than the least significant bit; and an OR circuit for receiving an output from said NOR circuit and the clock for delay element, an output from said OR circuit being output as the shift clock to the bidirectional shift register.

13. An oversampling D/A converter according to claims 4, 5, 8, or 9, wherein the shift-direction control signal is the output from the first delay element.

14. An oversampling D/A converter according to claims 2, 3, 4, 5, 6, 7, 8, or 9, wherein the bidirectional shift register comprises:

a plurality of registers being juxtaposed and a plurality of selectors equal in number to said plurality of registers and each positioned in a stage previous to a stage of the corresponding register, each of said registers having a data input terminal, a data output terminal, and a clock input terminal, said clock input terminal receiving the shift clock, each of said selectors receiving data output from the output terminal of the register positioned in the stage previous to the stage of the corresponding register and data output from the output terminal of the register positioned in a stage subsequent to the stage of the corresponding register, selecting the data from the register positioned in the previous stage if a value of the shift-direction control signal is +1 or selecting the data from the register in the subsequent stage if the value of the shift-direction control signal is −1, and outputting the selected data to the input terminal of the corresponding register.

15. An oversampling D/A converter according to claims 1, 2, 3, 4, 5, 6, 7, 8, or 9, wherein the bidirectional shift register has a data maintenance circuit for maintaining, if the register positioned in a first stage is holding data and data shift to a stage previous to the first stage is requested or if the register positioned in a final stage is holding data and data shift to a stage subsequent to the final stage is requested, the holding of data by the register in the first or final stage.

16. An oversampling D/A converter according to claim 14, wherein the bidirectional shift register comprises:

the plurality of registers being juxtaposed, the plurality of selectors equal in number to said plurality of registers and each positioned in the stage previous to the stage of the corresponding register, and first and second logic circuits, each of said registers having the data input terminal, the data output terminal, and the clock input terminal, said clock input terminal receiving the shift clock, said first logic circuit receiving data from the output terminal of the register positioned in a final stage and data from the output terminal of the register positioned in a stage previous to the final stage and performing logical OR operation between the two sets of data, said second logic circuit receiving data from the output terminal of the register positioned in a first stage and data from the output terminal of the register positioned in a stage subsequent to the first stage and performing the logical OR operation between the two sets of data, the selector corresponding to the register positioned in the final stage receiving an output from said first logic circuit and a zero signal representing the value of 0, selecting the output from said first logic circuit if the value of the shift-direction control signal is +1 or selecting said zero signal if the value of the shift-direction control signal is −1, and outputting the selected data to the input terminal of the register positioned in the final stage, the selector corresponding to the register positioned in the first stage receiving an output from said second logic circuit and the zero signal representing the value of 0, selecting said zero signal if the value of the shift-direction control signal is +1 or selecting the output from said second logic circuit if the value of the shift-direction control signal is −1, and outputting the selected data to the input terminal of the register positioned in the first stage, each of the selectors other than those corresponding to said registers positioned in the final stage and in the first stage receiving data output from the output terminal of the register positioned in the stage previous to the stage of the corresponding register and data output from the output terminal of the register positioned in the stage subsequent to the stage of the corresponding register, selecting the data from the register positioned in the previous stage if the value of the shift-direction control signal is +1 or selecting the data from the register positioned in the subsequent stage if the value of the shift-direction control signal is −1, and outputting the selected data to the input terminal of the corresponding register, said first and second logic circuits and the selectors corresponding to said registers positioned in the final stage and in the first stage constituting a data maintenance circuit.

17. An oversampling D/A converter according to claim 1, wherein the output potential selector has:
 a resistor interposed between the first reference potential and the second reference potential; and
 a plurality of switches connected to a plurality of points of said resistor,
 said switches being controlled by the outputs from the output terminals of the respective registers of the bidirectional shift register.

18. An oversampling D/A converter according to claim 1, wherein each of the plurality of registers of the bidirectional shift register has a set terminal, a reset terminal, and an additional specified data detector, said specified data detector detecting a coincidence between the output signal from said signal output unit and a predetermined value, a coincidence detect signal from said specified data detector being input to the set terminal of a specified one of all the registers constituting the bidirectional shift register and to the respective reset terminals of the other registers.

19. An oversampling D/A converter according to claim 18, wherein said specified data detector is composed of an AND circuit.

20. An oversampling D/A converter according to claim 19, wherein the AND circuit receives a digital output signal having a reduced number of bits from a second delay element and outputs, if the digital output signal coincides with a value of 0, the coincidence detect signal.

* * * * *